United States Patent [19]

Donovan, III et al.

[11] 4,325,992
[45] Apr. 20, 1982

[54] ELECTROLESS PLATING OF POLYCARBONATES

[75] Inventors: Lawrence P. Donovan, III, Monrovia; Eileen Maguire, Arcadia; David A. Dillard, Diamond Bar, all of Calif.

[73] Assignee: Crown City Plating Co., El Monte, Calif.

[21] Appl. No.: 222,591

[22] Filed: Jan. 5, 1981

[51] Int. Cl.³ .......................... C23C 3/02; B29C 17/08
[52] U.S. Cl. .................................... 427/307; 156/668; 427/306
[58] Field of Search ................. 156/668; 427/307, 306

[56] References Cited

U.S. PATENT DOCUMENTS

| | | | |
|---|---|---|---|
| 3,252,844 | 5/1966 | Hechelhammer | 156/668 |
| 3,394,023 | 7/1968 | Wilhelm | 427/306 |
| 3,518,067 | 6/1970 | Barth | 156/668 |
| 3,567,594 | 3/1971 | Wells | 427/307 |
| 4,125,649 | 11/1978 | Donovan et al. | 427/306 |

FOREIGN PATENT DOCUMENTS

| | | | |
|---|---|---|---|
| 51-24549 | 6/1976 | Japan | 427/307 |
| 52-60869 | 5/1977 | Japan | 427/306 |

*Primary Examiner*—John D. Smith
*Attorney, Agent, or Firm*—Christie, Parker & Hale

[57] ABSTRACT

Filled polycarbonate resin substrates are conditioned for electroless plating by contact with an alkaline conditioner having a pH of at least 8, followed by contact with an aqueous acid fluoride etch solution having a pH less than about 5 and a fluoride concentration of at least 1 mole per liter of solution.

35 Claims, No Drawings

ELECTROLESS PLATING OF POLYCARBONATES

BACKGROUND OF THE INVENTION

The present invention relates to electroless plating of polycarbonate resins, in particular, to providing a surface uniformly receptive to metals which catalyze electroless deposition of nickel and copper.

The benefits of electroless plated, non-conductive articles, particularly plastic articles, are well known. In the finished product, the desirable characteristics of the plastic and the metal are combined to offer thereby the technical and aesthetic advantages of each.

Polymeric substrates are conventionally plated by preconditioning the surface by contact with an aqueous solution of at least one organic compound active for "conditioning" or "pre-etching" the surface of the plastic, etching with a strong oxidizing acid or base, seeding the surface with a noble metal catalyst, e.g., a palladium chloride solution, then immersing the seeded surface in an autocatalytic electroless plating solution where an initial coating of a conductive metal, e.g., copper or nickel, is established by chemical deposition. The metal deposit acts as a buss to allow a thicker coating of metal to be built up electrolytically.

In U.S. Pat. No. 3,567,594 there is disclosed a process of electroless plating which involves incorporating a siliceous filler into a plastic; molding the resulting plastic; conditioning the molded plastic product by treating the plastic product, in series, with an acid chromate etch followed by an HF treatment; preplating the conditioned article with an electrolessly plateable metal and electroplating the preplated article. The process was demonstrated using certain ethylene propylene copolymers and polypropylene. The process was represented as utile for polycarbonates. We evaluated the process on a "plateable" grade of a propylene polymer manufactured and sold by the assignee of the U.S. Pat. No. 3,567,594, and found the treating procedures to be functional. We have not, however, found the process useful for treating other filled polymeric substrates.

SUMMARY OF THE INVENTION

It has now been found that electroless plating of filled polycarbonate resins can be enhanced by first contacting the filled polycarbonate resin substrate with an alkaline conditioner having a pH of at least about 8, preferably an aqueous solution of at least one alkali metal hydroxide in which the alkali metal hydroxide content is from about 2 percent by weight to solution saturation, more preferably from about 10 to about 50 percent by weight, still more preferably from about 25 to about 35 percent by weight. The alkaline conditioner is maintained to a temperature of from about 135° F. to the lesser of the boiling point of the solution and the softening point of the polycarbonate resin substrate, preferably from about 145° F. to about 210° F. The alkaline conditioner serves as an initial etchant. Contact is for a time sufficient to enable etching in an aqueous acid fluoride etch solution and may range from 0.5 minute or less to 20 minutes or more, preferably from about 3 to about 10 minutes.

The substrate is then contacted with an aqueous acid fluoride etch solution having a pH less than about 5 and having an effective fluoride concentration of at least about 1 mole per liter of solution to solution saturation as provided by at least one fluoride compound. Etch is at a temperature from ambient to the lower of the solution boiling point and softening temperature of the substrate. The preferred range is from about 125° F. to about 150° F. The concentration of the fluoride is sufficient to etch the filled polycarbonate resin surface and render it uniformly receptive to seeding by a metal catalyst and provide, when plated, an increased bond strength. Although a solution of hydrofluoric acid may be employed, it is preferred to employ a solution of another fluoride compound, preferably a fluoride salt in combination with hydrofluoric and/or a mineral acid. The presently preferred solutions are solutions containing the salt ammonium bifluoride in a concentration of at least about 3 percent by weight of solution, preferably promoted with sulfuric acid. The presently preferred acid fluoride etch solution contains from about 20 to about 40 percent by weight ammonium bifluoride and from about 5 to about 15 percent by weight sulfuric acid. The most preferred acid fluoride etch solution is one containing about 25 to 35 percent by weight ammonium bifluoride and about 8 to about 10 percent by weight sulfuric acid. Contact time may range from about 1 to about 20 minutes, preferably from about 3 to about 10 minutes.

To enhance surface appearance and eliminate bright spots, it is preferred to precede contact with the aqueous alkaline conditioning solution with a detergent rinse followed by pre-conditioning with a hydrolizer solution, which functions as described in U.S. Pat. No. 3,689,303, to render the resin surface hydrophilic.

Contact with the aqueous acid fluoride etch solution is followed by seeding the surface with a metal electroless plating catalyst which is a solution of metal ions or a suspension of metal particles.

Following seeding and activation of the metal catalyst by conventional means, the surface can be uniformly plated with electroless copper or nickel followed by electroplating in a conventional manner.

DETAILED DESCRIPTION

According to the present invention, there is provided a process which enables uniform electrodeposition of metals onto polycarbonate resin substrates. In particular, the process of the present invention is directed to electroless plating of filled polycarbonate resins which, as used herein, means polycarbonate resins containing at least about 10 percent by weight filler, in the form of mineral, glass and silica fillers, and mixtures thereof. The process is particularly adaptive to electroless plating of molded articles.

The process of the invention comprises, broadly, conditioning the filled polycarbonate resin substrate by contact with an alkaline conditioner having a pH of at least about 8 and maintained at a temperature of about 135° F. to the lesser of the boiling point of the conditioner and the softening point of the substrate, for a time sufficient to enable etch of the polycarbonate resin substrate with an aqueous acid fluoride etch. Contact time may range from about 0.5 minute or less to 20 minutes or more, preferably about 3 to about 10 minutes. This is followed by contact of the conditioned filled polycarbonate resin substrate with an aqueous acid fluoride etch solution having a pH of 5 or less and effective fluoride content of from about 1 mole per liter of solution to solution saturation at the temperature employed, as provided by at least one soluble fluoride compound. Contact is for a time sufficient to etch the surface and increase the bond strength of a deposited metal to the polycarbonate resin substrate. Contact time is preferably from about 1 to about 20 minutes, more preferably from about 3 to about 10 minutes. In general, short contact time gives the best appearance and lowest adhesions, whereas long contact times increase adhesion to the detriment of appearance.

In the process of the invention, the alkaline conditioner serves an etch function to a limited degree, but is insufficient for industrial application. The aqueous acid fluoride etch solution is not in itself functional without use in combination with the aqueous alkaline conditioner.

Although an optional step, the preferred first step in the practice of the invention is to cleanse and render the surface of the polycarbonate resin substrate hydrophilic. This prevents air bubbles from accumulating at the substrate surface during immersion in the alkaline conditioner and eliminates "bright spots" on the deposited plate. It is preferred to thoroughly clean the filled polycarbonate resin substrate by first contacting the substrate with a detergent solution. The presently preferred detergent solution is an aqueous solution containing from about 0.5 to about 1 percent by weight of a nonionic detergent, preferably an ethylene oxide condensate. Typical immersion time is about 1 minute. This is followed by contact with a hydrolizer solution described in detail in U.S. Pat. No. 3,689,303, incorporated herein by reference. The hydrolizer solution serves to further clean the polycarbonate resin substrate and render the surface hydrophilic. The presently preferred hydrolizer solution is an aqueous solution containing 100 grams/liter of chromic acid in 400 mls/liter of sulfuric acid. Contact time is not narrowly critical, but typically contact times in the order of 2 to 3 minutes at temperatures from 100° F. to 160° F. or more are employed.

After cleansing, the filled polycarbonate resin substrate is conditioned in an alkaline conditioner prior to etch in the aqueous acid fluoride etch solution. The alkaline conditioners useful in the practice of the instant invention have a pH of at least about 8 and are preferably aqueous solutions of at least one alkali metal hydroxide in which the alkali metal hydroxide content is from about 2 percent by weight to solution saturation, more preferably from about 10 to about 50 percent by weight, still more preferably from about 25 to about 35 percent by weight alkali metal hydroxide. Although solutions of alkali metal hydroxide, particularly sodium hydroxide, are preferably used as the alkaline conditioner, other alkaline compounds such as sodium metasilicate, trisodium phosphate, sodium carbonate, polyalkyl polyamines, such as triethylene tetramines, alone or in admixture with an alkali metal hydroxide, and if liquid, neat or diluted with water. It is preferred that the conditioner be maintained at a temperature from about 145° F. to about 210° F.

After conditioning in the alkaline conditioner, the polycarbonate resin substrate to be electrolessly plated is rinsed and passed to the aqueous acid fluoride etch solution, which is a solution maintained at a pH of 5 or less and provides dissolved fluoride (F) to a level of at least 1 mole per liter of solution to solution saturation. Contact is for a time sufficient to increase the bond of the electrolessly deposited plate over that achieved with the alkaline conditioner and may range from about 1 to about 20 minutes, preferably from about 3 to about 10 minutes.

A variety of soluble fluoride compounds may be employed in the makeup of the acid fluoride etch. Although acids such as hydrofluoric acid, fluorosulfonic acid and fluoroboric acid and the like may be used, it is preferred to employ another fluoride compound used alone or in combination with hydrofluoric or a mineral acid, such as hydrochloric, sulfuric and nitric acid. Compounds which may be employed are those compounds capable of liberating fluoride ions in an acid medium, such as sodium bifluoride, lithium fluoride and the like. The presently preferred aqueous acid fluoride solutions are solutions based on salts of a weak acid and a base, particularly ammonium bifluoride, used alone or in combination with a mineral acid. The latter is preferred. The ammonium bifluoride is provided in a concentration of at least about 3 percent by weight of solution. Without being bound by theory, it appears that the ammonium bifluoride serves as a reservoir for active fluoride ions and provides more fluoride ions to solution as it is consumed. The mineral acid, particularly sulfuric acid, appears to enhance the activity of the fluoride in providing bond strengths generally twice that achieved in the absence of the mineral acid, which is not per se functional.

As indicated, the presently preferred solutions are solutions of ammonium bifluoride, present in a concentration of about 20 to about 40 percent by weight, more preferably about 25 to about 35 percent by weight, alone or in combination with a mineral acid, preferably sulfuric acid, present in a concentration of about 5 to about 15 percent by weight of solution. Although not required, a buffering agent, as well as other salts such as ammonium sulfate, may be present. Etch temperature will range from ambient to the lesser of the boiling point of the solution or softening temperature of the resin, preferably in the range from about 125° F. to about 150° F. Contact time will range generally from about 1 to about 20 minutes, preferably from about 3 to about 10 minutes.

In connection with an aqueous acid fluoride etch solution based on the use of ammonium bifluoride alone or in combination with sulfuric acid, it has been observed that the degree of adhesion achieved will be substantially independent of concentration of the ammonium bifluoride within the ranges prescribed above, and adhesion of a plate to the surface of the substrate will increase with contact time. Shorter contact times are preferred for appearance purposes.

As with every other step in the process sequence, following contact with the aqueous acid fluoride solution, the substrate is rinsed, preferably in deionized water, and subjected to the steps of electroless and electrolytic plating by methods known in the art.

The electroless plating catalysts employed may be noble metal or non-noble metal based. Non-noble metal catalysts are described in U.S. Pat. No. 3,958,048 to the same assignee as this application and incorporated herein by reference.

A noble metal catalyst in an aqueous medium is presently preferred. By a "noble metal catalyst contained in an aqueous medium" there is meant an ionic solution or colloidal suspension of the free metals. Colloidal suspensions are preferred. The noble metals include gold, platinum and palladium, with palladium preferred.

A suitable ionic bath is one containing palladium chloride in a concentration of about 0.2 gram per liter solution and 3 ml of concentrated hydrochloric acid per liter of solution. Following seeding, the palladium can be reduced to the free metal state by immersion in a bath of a reducing agent such as dimethyl amine borane.

Colloidal suspensions of noble metals are described in U.S. Pat. No. 3,011,920 to C. R. Shipley, Jr., incorporated herein by reference. Such suspensions are colloidal in nature in which the noble metal colloid is maintained in suspension by a protective colloid, i.e., stannic acid colloids. Following seeding, the colloid is removed by immersion in an acidic or alkaline accelerator solution to remove the protective colloid and expose the absorbed noble metal.

Although less preferred, there may also be employed a seeding method which involves contacting the etched article with a sensitizing solution containing stannous chloride followed by immersion in an activator solution such as a palladium chloride solution where the ionic palladium is reduced to the free metal on the surface of the substrate.

Suitably activated, the article may be electrolessly plated by conventional means. Electroless copper and nickel formulations, such as those described in U.S. Pat. Nos. 3,011,920 and 3,874,072, incorporated herein by reference, may be employed. Excellent results have been obtained using electroless nickel solutions. Electroless copper solutions are typically based on a soluble copper salt, such as copper sulfate, a complexing agent for the cupric ion such as Rochelle salt, an alkali hydroxide for adjustment of pH, a carbonate radical as a buffer and a reducing agent for the cupric ion such as formaldehyde.

Following electroless plating, the substrate may be electrolytically plated by conventional means, with nickel, gold, silver, chromium and the like to provide the desired finish on the article. It has been observed that adhesion will increase with age of the plate.

In the following Examples and Controls, seeding of the treated substrate was with a proprietary colloidal tinpalladium catalyst as described in U.S. Pat. No. 3,011,920 at an acid molarity of about 1.7. An alkaline accelerator was used to expose the palladium metal. The catalyst was maintained at about 115° F. and the accelerator at about 100° F. The electroless nickel solution employed was Cuposit ™ PM-980 manufactured and sold by the Shipley Company. Immersion was for about 8 minutes and the solution was maintained at between 90° F. to 105° F.

Following electroless plating, the article was electrolytically plated. In this operation, the substrate was rinsed in deionized water, soaked in an alkaline cleaner, then passed to a reverse current cleaner, an acid dip, bright acid copper and nickel electrolytic plating solutions and finally to a chromium plating solution to a thickness of 2 mils.

Plated articles were heated to 225° F. for two hours to determine if plate failure occurred.

CONTROL A AND EXAMPLE 1

Tests were conducted to compare the effect of the use of a sodium hydroxide solution alone and to such solution in combination with an aqueous solution of ammonium bifluoride and sulfuric acid on the bond of an electroless plate to a polycarbonate substrate. For purposes of the tests, companion plaques were molded from a glass-filled polycarbonate. The aqueous solution of sodium hydroxide employed contained HaOH in a concentration of about 475 g/l. The aqueous solution of ammonium bifluoride and sulfuric acid contained 350 g/l of ammonium bifluoride and 60.6 cc/l of concentrated sulfuric acid (1.84 specific gravity). The procedure followed was to first immerse the molded substrate for one minute in a 0.05 to 0.1 percent by weight aqueous solution of a nonionic detergent known as Intravon JU, manufactured and sold by Crompton and Knowles, and then in a hydrolizer solution formed of 396 g/l $CrO_3$ and 185 cc concentrated sulfuric acid. This was a treatment to cleanse and render the surface hydrophylic and to eliminate surface bright spots. The Controls were immersed in the sodium hydroxide solution only while the Examples were immersed in the sodium hydroxide solution and the ammonium bifluoride-sulfuric acid solution described below.

Control A was immersed only in the sodium hydroxide solution maintained at 182° F. for 7 minutes. The substrate was then catalyzed, electrolessly plated with nickel, then electrolytically plated to a thickness of about 2 mils. Bond strength ranged from 0.9 to 1.3 lbs/in., averaging 1.2 lbs/in. The plate blistered during heating at 225° F. for 2 hours. For example 1, the same procedure was followed, except that the substrate, following preconditioning in the sodium hydroxide solution, was immersed for 10 minutes in the aqueous solution of ammonium bifluoride and sulfuric acid at a solution temperature of 136° F. Bond strength ranged between 1.4 and 1.9 lbs/in., and averaged 1.65 lbs/in. When heated to 225° for two hours, failure of the plate did not occur.

CONTROL B AND EXAMPLE 2

The procedure for Control A and Example 1 were repeated, except that immersion in the sodium hydroxide solution was for 5 minutes at a solution temperature of 195° F. For Control B, where immersion in the solution of ammonium bifluoride and sulfuric acid did not occur, adhesion ranged from 0 to 2.4 lbs/in., averaging 1.7 lbs/in. Again, the plate blistered from the substrate during heating to 225° F. When, however, the substrate was, as in Example 1, also immersed in the solution of ammonium bifluoride and sulfuric acid for 10 minutes at a solution temperature of 136° F., following immersion in the sodium hydroxide solution, peel strength ranged from 1.6 lbs/in. to 3.3 lbs/in., and averaged 2.3 lbs/in. Plate failure did not occur when the substrate was heated to 225° F. for two hours.

What is claimed is:

1. A process for preparing the surface of filled polycarbonate resin substrate for electroless plating which comprises:
    (a) forming a conditioned filled polycarbonate resin substrate by contacting the filled polycarbonate resin substrate with an alkaline conditioner having a pH of at least about 8 and maintained at a temperature from about 135° F. to the lesser of the boiling point of the solution and the softening temperature of the filled polycarbonate resin substrate for a time sufficient to render the substrate receptive to etch by an acid fluoride etch solution; and
    (b) etching the conditioned filled polycarbonate resin substrate by contact with an aqueous acid fluoride etch solution having a pH less than about 5 and containing fluoride in concentration of from about 1 mole per liter of solution to solution saturation as provided by at least one soluble fluoride compound for a time sufficient to etch the surface of the filled polycarbonate resin substrate and increase adhesion of an electrolessly deposited metal thereto.

2. A process as claimed in claim 1 in which the alkaline conditioner is an aqueous alkaline conditioning solution containing at least one alkali metal hydroxide in a concentration of from about 2 percent by weight to solution saturation.

3. A process as claimed in claim 2 in which the alkali metal hydroxide content of the alkaline conditioning solution is from about 25 to about 35 percent by weight of solution.

4. A process as claimed in claim 1 in which the alkaline conditioner is maintained at a temperature of from about 145° F. to about 210° F.

5. A process as claimed in claim 1 in which the filled polycarbonate resin substrate is contacted with the alkaline conditioner for a time of from about 0.5 minute to about 20 minutes.

6. A process as claimed in claim 1 in which the filled polycarbonate resin substrate is contacted with the alkaline conditioner for a time of from about 3 to about 10 minutes.

7. A process as claimed in claim 1 in which the aqueous acid fluoride etch solution is at a temperature of from about 125° F. to about 150° F.

8. A process as claimed in claim 1 in which the conditioned filled polycarbonate resin substrate is contacted with the aqueous acid fluoride etch solution for a period of from about 1 to about 20 minutes.

9. A process as claimed in claim 1 in which the conditioned polycarbonate resin substrate is contacted with the aqueous acid fluoride etch solution for a period of from about 3 to about 10 minutes.

10. A process as claimed in claim 1 in which the aqueous acid fluoride etch solution comprises from about 20 to about 40 percent by weight ammonium bifluoride.

11. A process as claimed in claim 1 in which the aqueous acid fluoride etch solution comprises from about 25 to about 35 percent by weight ammonium bifluoride.

12. A process as claimed in claim 10 in which the aqueous acid fluoride etch solution comprises an acid selected from the group consisting of a mineral acid, hydrofluoric acid and mixtures thereof.

13. A process as claimed in claim 11 in which the aqueous acid fluoride etch solution comprises from about 5 to about 15 percent by weight sulfuric acid.

14. A process for preparing a surface of filled polycarbonate resin substrates for electroless plating which comprises:
(a) forming a conditioned filled polycarbonate resin substrate by contacting the filled polycarbonate resin substrate with an aqueous alkaline conditioning solution containing at least one alkali metal hydroxide in which the total alkali metal hydroxide concentration is from 2 percent by weight of the solution to solution saturation and maintained at a temperature from about 135° F. to the lesser of the boiling point of the solution and the softening temperature of the filled polycarbonate resin substrate for a period of time of from about 0.5 to about 20 minutes; and
(b) forming an etched filled polycarbonate resin substrate by contacting the conditioned filled polycarbonate resin substrate with an aqueous acid fluoride etch solution comprising from about 3 percent by weight of solution to solution saturation of ammonium bifluoride for a time sufficient to etch the surface of the filled polycarbonate resin substrate and increase adhesion of an electroless deposited metal thereto.

15. A process as claimed in claim 14 in which the alkali metal hydroxide content of the aqueous alkaline conditioning solution is from about 10 to about 50 percent by weight of solution.

16. A process as claimed in claim 14 in which the alkali metal hydroxide content of the aqueous alkaline conditioning solution is from about 25 to about 35 percent by weight of solution.

17. A process as claimed in claim 14 in which the aqueous alkaline conditioning solution is maintained at a temperature of from about 140° F. to about 210° F.

18. A process as claimed in claim 14 in which the filled polycarbonate resin substrate is contacted with the aqueous alkaline conditioning solution for a time of from about 3 to about 10 minutes.

19. A process as claimed in claim 14 in which the aqueous acid fluoride etch solution is at a temperature of from 125° F. to 150° F.

20. A process as claimed in claim 14 in which the conditioned polycarbonate resin substrate is contacted with the aqueous acid fluoride etch solution for a period of from about 1 to about 20 minutes.

21. A process as claimed in claim 14 in which the conditioned polycarbonate resin substrate is contacted with the aqueous acid fluoride etch solution for a period of from about 3 to about 10 minutes.

22. A process as claimed in claim 15 in which the conditioned polyester substrate is contacted with the aqueous acid fluoride etch solution for a period of from about 3 to about 10 minutes.

23. A process as claimed in claim 15 in which the aqueous acid fluoride etch solution comprises from about 20 to about 40 percent by weight ammonium bifluoride.

24. A process as claimed in claim 15 in which the aqueous acid fluoride etch solution comprises from about 25 to about 35 percent by weight ammonium bifluoride.

25. A process as claimed in claim 23 in which the aqueous acid fluoride etch solution comprises an acid selected from the group consisting of a mineral acid, hydrofluoric acid and mixtures thereof.

26. A process for preparing the surface of polycarbonate resin substrates for electroless plating which comprises:
(a) forming a conditioned filled polycarbonate resin substrate by contacting the filled polycarbonate resin substrate with an aqueous alkaline conditioning solution of at least one alkali metal hydroxide in which the total alkali metal hydroxide concentration is from about 10 to about 50 percent by weight of the solution to solution saturation and maintained at a temperature of from about 135° F. to the lesser of the boiling point of the solution and the softening temperature of the polycarbonate resin surface for a period of time of from about 0.5 to about 20 minutes; and
(b) forming an etched polycarbonate resin substrate by contacting the conditioned polycarbonate resin substrate with an aqueous acid fluoride etch solution comprising from about 20 to about 40 percent by weight ammonium bifluoride in combination with an acid selected from the group consisting of hydrofluoric acid and a mineral acid for a period of time of from about 1 to about 20 minutes.

27. A process as claimed in claim 26 in which the alkali metal hydroxide content of the alkaline conditioning solution is from about 25 to about 35 percent by weight of solution.

28. A process as claimed in claim 26 in which the filled polycarbonate resin substrate is contacted with the alkaline conditioning solution for a time of from about 3 to about 10 minutes.

29. A process as claimed in claim 26 in which the aqueous acid fluoride etch solution is at a temperature of from about 125° F. to about 150° F.

30. A process as claimed in claim 26 in which the conditioned polycarbonate resin substrate is contacted with the aqueous acid fluoride etch solution for a period of from about 3 to about 10 minutes.

31. A process as claimed in claim 26 in which the alkaline conditioning solution is maintained at a temperature of from about 145° F. to about 210° F.

32. A process as claimed in claim 26 in which the acid is sulfuric acid.

33. A process for preparing the surface of filled polycarbonate resin substrates for electroless plating which comprises:
(a) forming a conditioned filled polycarbonate resin substrate by contacting the filled polycarbonate resin substrate with an aqueous alkaline conditioning solution of at least one alkali metal hydroxide in which the total alkali metal hydroxide concentration is from about 10 percent by weight of the solution to solution saturation and maintained at a temperature of from about 135° F. to the lesser of the boiling point of the solution and the softening temperature of the polycarbonate resin surface for a period of time of from about 0.5 to about 20 minutes; and
(b) forming an etched polycarbonate resin substrate by contacting the conditioned polycarbonate resin substrate with an aqueous acid fluoride etch solution comprising from 20 to about 40 percent by weight ammonium bifluoride and from about 5 to about 15 percent by weight sulfuric acid for a period of time of from 1 to about 20 minutes.

34. A process as claimed in claim 33 in which the alkali metal hydroxide content of the alkaline conditioning solution is from about 25 to about 35 percent by weight of solution.

35. A process as claimed in claim 33 in which the filled polycarbonate resin substrate is contacted with the alkaline conditioning solution for a time of from about 3 to about 10 minutes.

* * * * *

UNITED STATES PATENT AND TRADEMARK OFFICE
CERTIFICATE OF CORRECTION

PATENT NO. : 4,325,992

DATED : April 20, 1982

INVENTOR(S) : Lawrence P. Donovan
David A. Dillard

It is certified that error appears in the above—identified patent and that said Letters Patent are hereby corrected as shown below:

Column 1, lines 53 and 54, between "maintained" and "a" delete "to" and insert -- at --. Column 5, line 43, "Cuposit TM" should be -- Cuposit$^{TM}$ --; line 65, "HaOH" should be -- NaOH --. Column 6, line 21, "example" should be -- Example --.

Signed and Sealed this

First Day of November 1983

[SEAL]

Attest:

GERALD J. MOSSINGHOFF

Attesting Officer

Commissioner of Patents and Trademarks